United States Patent [19]

Oguri et al.

[11] Patent Number: 4,716,029
[45] Date of Patent: * Dec. 29, 1987

[54] BOEHMITE

[75] Inventors: Yasuo Oguri, Tokyo; Junji Saito, Yokohama; Naoto Kijima, Tokyo, all of Japan

[73] Assignee: Mitsubishi Chemical Industries Ltd., Tokyo, Japan

[*] Notice: The portion of the term of this patent subsequent to Dec. 16, 2003 has been disclaimed.

[21] Appl. No.: 809,049

[22] Filed: Dec. 16, 1985

Related U.S. Application Data

[63] Continuation-in-part of Ser. No. 641,722, Aug. 17, 1984, abandoned.

[30] Foreign Application Priority Data

Feb. 23, 1982 [JP]  Japan .................................. 57-28008
Oct. 29, 1982 [JP]  Japan ................................ 57-190074
Aug. 23, 1983 [JP]  Japan ................................ 58-153466

[51] Int. Cl.$^4$ ............................................. C01F 7/02
[52] U.S. Cl. ..................................... 423/625; 423/628
[58] Field of Search ............................. 423/625, 628

[56] References Cited

U.S. PATENT DOCUMENTS 4,505,866  3/1985  Oguri et al. ......................... 264/42
4,629,618  12/1986  Oguri et al. ....................... 423/625

Primary Examiner—Robert L. Stoll
Attorney, Agent, or Firm—Oblon, Fisher, Spivak, McClelland & Maier

[57] ABSTRACT

A boehmite having an orthorhombic crystal form in which the ratio of the maximum length in the direction of the a-axis of the crystal to the distance between the opposing crystal faces perpendicular to the c-axis of said crystal is at least 10, said maximum length in the direction of the a-axis of the crystal is at least 2500 Å and said distance between the opposing faces perpendicular to the c-axis of said crystal is 250–900 Å.

1 Claim, 5 Drawing Figures

BOEHMITE

This application is continuation in part of U.S. patent application Ser. No. 641,722 filed Aug. 17, 1984 now abandoned and refiled as Ser. No. 840,543, now U.S. Pat. No. 4,629,618.

BACKGROUND OF THE INVENTION

1. Field of the Invention

The present invention relates to a boehmite having a novel crystal form.

2. Description of the Prior Art

A boehmite is obtainable by the hydrothermal treatment of an aqueous slurry of a boehmite-forming compound such as gibbsite, and has a characteristic crystal form.

FIG. 1 is a schematic view illustrating the crystal form of the conventional boehmite. The boehmite belongs to an orthorhombic system. However, the crystal faces constituting the external form of the crystal are (110), ($\overline{1}10$) and (001), whereby the interfacial angle between ($\overline{1}10$) and (110) faces is 76° or 104°, and the interfacial angle between (110) and (001) faces and the interfacial angle between ($\overline{1}10$) and (001) faces are 90°. The a-axis is parallel to (001) face and coincides with a bisector of the interfacial angle of 104° between (110) and ($\overline{1}10$) faces The b-axis is parallel to (001) face and coincides with a bisector of the interfacial angle of 76° between (110) and ($\overline{1}10$) faces.

As shown in the scanning electron micrograph (8000 magnifications) of FIG. 2, in the conventional boehmite, (001) crystal face has a diamond or rhombic shape, and ($\overline{1}10$) and (110) crystal faces are rectangular, and the external form of the entire crystal is monoclinic prismatic.

SUMMARY OF THE INVENTION

The present invention is to provide a boehmite having a novel crystal form which is entirely different from the conventional boehmite.

Namely, the present invention provides a boehmite having a crystal form wherein the ratio of the maximum length in the direction of the a-axis to the distance between the opposing crystal faces perpendicular to the c-axis (hereinafter referred to as the length in the direction of the c-axis) is at least 10, said maximum length in the direction of the a-axis of the crystal is at least 2500 Å and said length in the direction of the c-axis of said crystal is 250–900 Å.

BRIEF DESCRIPTION OF THE DRAWINGS

In the accompanying drawings.

DETAILED DESCRIPTION OF THE INVENTION

Figure 1:
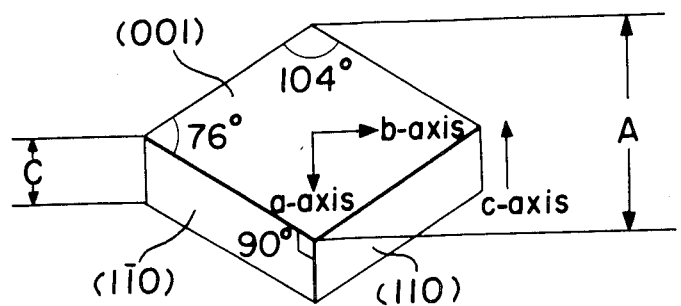
FIG. 1 is a schematic view illustrating the crystal form of the conventional boehmite.
Figure 3:
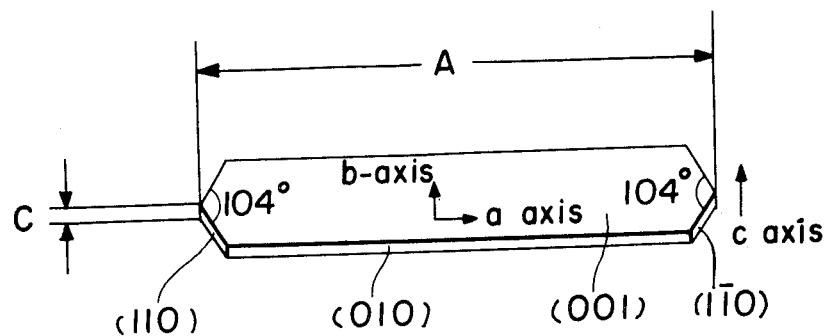
FIG. 3 is a schematic view illustrating the crystal form of the boehmite of the present invention.

The boehmite of the present invention is characterized by the ratio of the maximum length in the direction of the a-axis (i.e. length A as shown in FIGS. 1 and 3) to the length in the direction of the c-axis (i.e. length C as shown in FIGS. 1 and 3).

Figure 2:
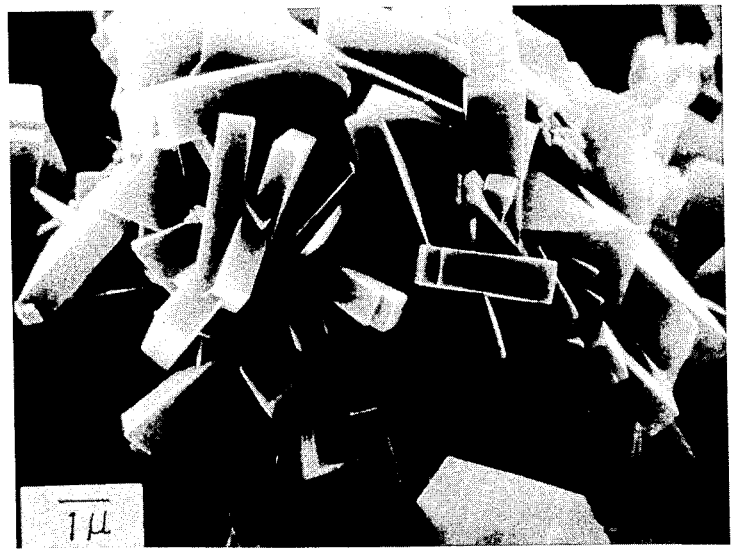
FIG. 2 is a scanning type electron micrograph (8000 magnifications) showing the crystal form of the conventional boehmite.
Figure 4:
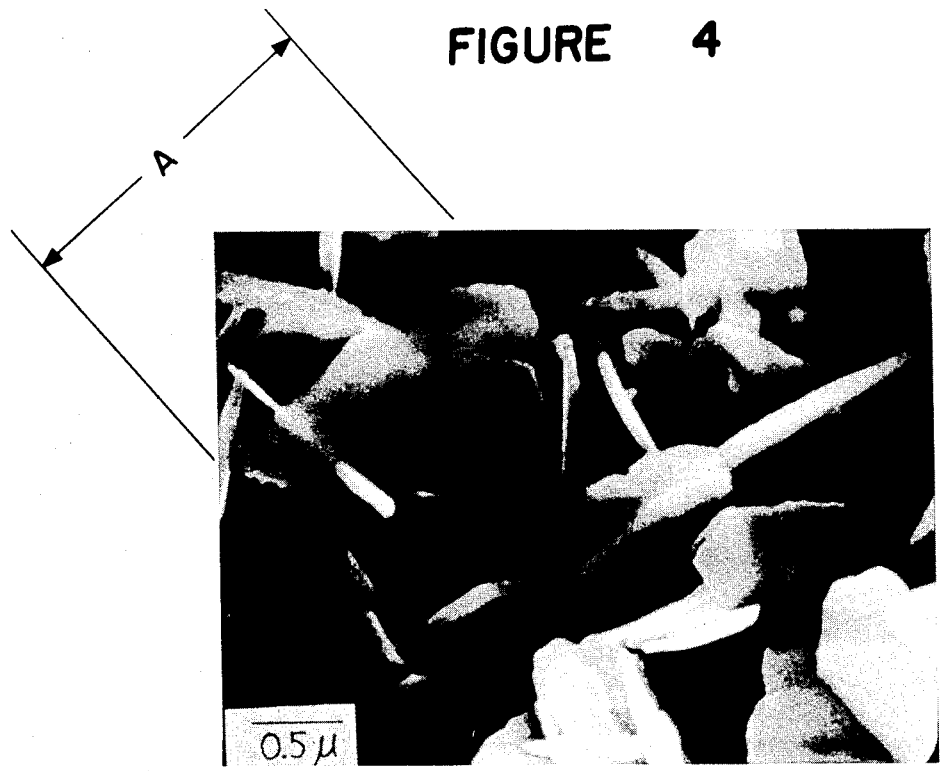
FIG. 4 is a scanning electron micrograph (28000 magnifications) showing the crystal form of the boehmite of the present invention.

Referring to FIGS. 1 and 2, in the conventional boehmite, the ratio of the length A to the length C is at most 5. Whereas, as shown in FIGS. 3 and 4, the boehmite of the present invention has a ratio of A/C being at least 10, and the length A is substantially longer than that of the conventional boehmite. The boehmite of the present invention is extremely grown in the direction of the a-axis, and has (010) crystal faces which do not appear on the crystal form of the conventional boehmite. Further, the boehmite of the present invention is characterized by the length A. Heretofore, with respect to a pseudo-boehmite, there has been produced a product having the ratio of A/C being at least 10 and the length A being at least 2500 Å. However, no boehmite has been produced which has the ratio of A/C being at least 10 and the length A being at least 2500 Å. In the conventional boehmite, a product having the length A of at least 2500 Å is a boehmite having the ratio of A/C being at most 5. Whereas, in the boehmite of the present invention, the ratio of A/C is at least 10, and at the same time, the length A is at least 2500 Å.

Further, the boehmite of the present invention is characterized in that the length in the direction of the c-axis is within a range of from 250 to 900 Å. When the boehmite is used as a heat insulating material or a precursor for the preparation of an α-alumina shaped product, it is fatal that cracks appear in the shaped product during the heat treatment. The formation of cracks is attributable to the strain in the shaped product caused by the difference in the thermal expansion or shrinkage due to a temperature difference at various portions of the shaped product during the heat treatment. Therefore, the heat insulating material or the shaped product in which boehmite is used (hereinafter referred to as the "boehmite shaped product"), is required to have not only high strength but also a minimum thermal expansion or shrinkage coefficient.

Figure 5:
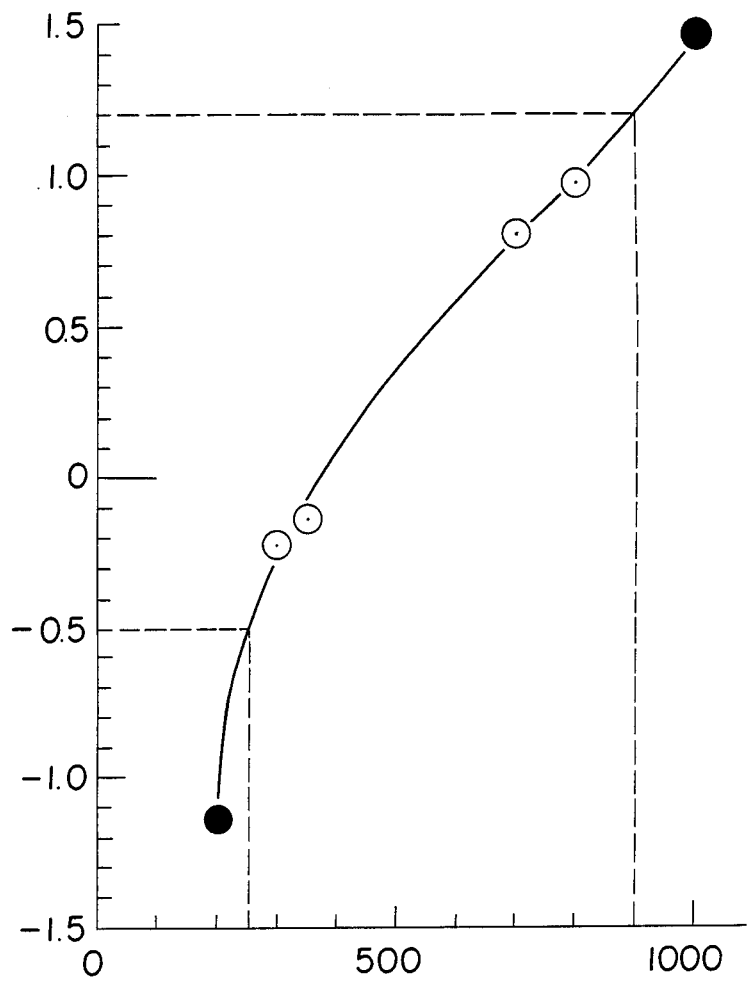
FIG. 5 is a graph showing the relation between the length in the direction of the c-axis of the boehmite crystal and the thermal expansion coefficient.

Boehmite undergoes a phase transition at 450°–650° C. to γ-alumina, whereby it undergoes a thermal expansion or shrinkage. Therefore, the cracking of the boehmite shaped product during the heat treatment takes place within this temperature range. The present inventors have taken the difference in the thermal expansion coefficient of the shaped product (hereinafter referred to as "$\alpha_H$") within this temperature range of 450°–650° C. as a parameter for the prevention of cracking, and sought for a factor controlling the difference in the thermal expansion coefficient. As a result, it has been found that the formation of cracks in the shaped product can be prevented when the thermal expansion coefficient is from −0.5 to +1.2%, and that the factor for controlling the thermal expansion coefficient is related to the length in the direction of the c-axis of the boehmite crystal. The relation of the thermal expansion coefficient of the boehmite shaped product with the length in the direction of the c-axis is shown in the FIG. 5. FIG. 5 is a graph showing the relation between the thermal expansion coefficient of the boehmite shaped product at 450°–650° C. and the length in the direction of the c-axis of the boehmite crystal, when a boehmite shaped product of a regular brick size (230×114×65 mm) was heated from all direction in an electric furnace. It is evident from the Figure that no cracks form where the difference in the thermal expansion coefficient ($\alpha_H$) is within a range of from −0.5 to +1.2%, and that in order to control $\alpha_H$ to a level with the range of from −0.5 to +1.2, the length in the direction of the c-axis of the boehmite crystal should be within a range of from 250 to 900 Å.

The boehmite of the present invention may be prepared in the following manner. Namely, the boehmite of the present invention may be readily obtained by subjecting an aqueous slurry of a boehmite-forming compound to hydrothermal treatment in the presence of a calcium compound and an organic compound having an alcoholic hydroxyl group, in the slurry.

As the boehmite-forming compound, there may be employed an aluminum-containing compound capable of forming a boehmlite under the condition for hydrothermal treatment at a temperature of at least 100° C., such as gibbsite, bayerite or $p$-alumina.

The amount of the water to form an aqueous slurry is usually selected within a range of from 30 to 300 parts by weight relative to 100 parts by weight of the boehmite-forming compound. If the amount of the water is too small, the viscosity of the aqueous slurry tends to be too high, whereby the operation such as stirring tends to be difficult. On the other hand, if the amount of water is too great, an unnecessary great amount of heat energy will be wasted during the hydrothermal treatment, such being uneconomical.

As the calcium compound, there may be employed a calcium compound capable of supplying calcium ions in the aqueous slurry during the hydrothermal treatment, such as $CaO$, $Ca(OH)_2$ or $CaAl_2O_4$. The amount of the calcium compound is usually selected within a range of from 0.05 to 20 parts by weight, preferably from 0.1 to 10 parts by weight, as calculated as Ca relative to 100 parts by weight of the boehmite-forming compound as calculated as $Al_2O_3$.

As the organic compound having an alcoholic hydroxyl group, various organic compounds may be employed. However, it is usual to employ those having a boiling point higher than the temperature for the hydrothermal treatment. Although it is possible to employ a compound having one hydroxyl group, it is preferred to use a compound having at least two hydroxyl groups. As specific examples, there may be mentioned ethylene glycol, polyvinyl alcohol and hydroxy ethyl cellulose. The amount of such a compound is selected within a range of from 0.01 to 100 parts by weight, preferably from 0.1 to 50 parts by weight relative to 100 parts by weight of the boehmite-forming compound as calculated as $Al_2O_3$. Further, in order to obtain the boehmite of the present invention, it is important to control the ratio of Ca to $Al_2O_3$ (Ca/$Al_2O_3$) and the ratio of the organic compound having an alcoholic hydroxyl group to $Al_2O_3$ (OH-cpd./$Al_2O_3$). When the weight ratio of Ca/$Al_2O_3$ is greater than 1.2 wt. %, then it is necessary to increase the weight ratio of OH-cpd./$Al_2O_3$ greater thar 9 wt. %. On the other hand, when the weight ratio of Ca/$Al_2O_3$ is less than 0.7 wt. %, then it is necessary to decrease the weight ratio of OH-cpd./$Al_2O_3$ less than 15 wt. %. When the weight ratio of Ca/$Al_2O_3$ is between 0.7 and 1.2 wt. %, then the weight ratio of OH-cpd./$Al_2O_3$ is between 9 and 15 wt. %.

The hydrothermal treatment is conducted at a temperature of from 100° to 400° C., preferably from 150° to 300° C. under a pressure of from 1 to 1000 kg/cm$^2$G, preferably from 5 to 100 kg/cm$^2$G for from 0.1 to 100 hours, preferably from 1 to 10 hours.

The boehmite may be used, for instance, as a heat-insulating material in the form of a shaped product. The shaped product made of the boehmite of the present invention has the following advantages. Namely, the boehmite of the present invention has a ratio of A/C being substantially greater than that of the conventional boehmite, and accordingly, when such a boehmite is molded into a shaped product, the intertwining of the boehmite crystals with one another is firm, whereby the shaped particle has high strength. Accordingly, in order to provide the same level of strength to the shaped product, it is possible to obtain a shaped product having a lower bulk density than the conventional boehmite. In general, when a shaped product is used as a heat insulating material, the lower the bulk density of the shaped product, the better the heat-insulating property.

As mentioned above, a pseudo-boehmite has been known to have a high A/C ratio. However, a shaped product thereof undergoes substantial shrinkage when heated for conversion to alumina, and it is not suitable for application to heat insulating materials. Whereas, the boehmite of the present invention has good crystallinity and undergoes no substantial shrinkage when heated. Thus, when used as a heat insulating material, there is no disadvantage as mentioned above. Further, the length in the direction of c-axis of the boehmite crystal of the present invention is 250–900 Å and when such boehmite is molded into a shaped product, the formation of cracks in the shaped product can be prevented when the shaped product is exposed to high temperature.

As a method for producing a shaped product made of the boehmite of the present invention, there may be mentioned a method wherein an aqueous slurry comprising a boehmite-forming compound, a calcium compound and an organic compound having an alcoholic hydroxyl group is molded, followed by hydrothermal treatment, or a method wherein this aqueous slurry is subjected to hydrothermal treatment, followed by molding. In the boehmite shaped product thus obtained, substantially the total amount of crystals constituting the shaped product has the above-mentioned specific crystal form, and thus the shaped product exhibits superior effects as an heat insulating material, as mentioned above.

Now, the present invention will be described in further detail with reference to an Example.

EXAMPLE 1

100 parts by weight of gibbsite, 1.6 parts by weight of calcium hydroxide and 100 parts by weight of an aqueous solution containing 10% of polyvinyl alcohol, were stirred at room temperature to obtain an aqueous slurry.

This slurry was injected into a mold and subjected to hydrothermal treatment at 200° C. under pressure of 15 kg/cm$^2$G for 4 hours. Then, the treated product was dried at 100° C. for 24 hours to obtain a boehmite. The scanning electron micrograph (28000 magnifications) of the boehmite thus obtained, is shown in FIG. 4.

As shown in FIG. 4, the crystal form of the boehmite is such that the length in the direction of the c-axis (length C) is about 800 Å, and the maximum length in the direction of the a-axis (length A) is about 18000 Å in an average, and the ratio of the latter to the former is 22.5.

A boehmite shaped product made of the above boehmite crystals and having a rectangular shape of 230×114×65 mm was heated in an electric furnace at a heating rate of 200° C./hr. to 1100° C. and was cooled at a cooling rate of 200° C./hr. to room temperature. The shaped product thus treated had no cracks.

COMPARATIVE EXAMPLE 1

100 parts by weight of gibbsite, 1.6 parts by weight of calcium hydroxide and 100 parts by weight of an aqueous solution containing 5% of polyvinyl alcohol, were stirred at room temperature to obtain an aqueous slurry. This slurry was injected into a mold and subjected to hydrothermal treatment at 200° C. under pressure of 15 kg/cm$^2$G for 4 hours. Then, the treated product was dried at 100° C. for 24 hours to obtain a boehmite.

The crystal form of the boehmite is such that the distance between the opposing crystal faces perpendicular to the c-axis (length C) is about 1000 Å and the maximum length in the direction of the a-axis (length A) is about 25000 Å in an average.

A boehmite shaped product made of the above boehmite crystals and having the same size as Example 1 was heated under the same conditions as in Example 1. The shaped product thus treated was found to have cracks.

COMPARATIVE EXAMPLE 2

100 parts by weight of gibbsite, 0.8 parts by weight of calcium hydroxide and 100 parts by weight of an aqueous solution containing 10% of polyvinyl alcohol, were stirred at room temperature to obtain an aqueous slurry. This slurry was injected into a mold and subjected to hydrothermal treatment at 200° C. under pressure of 15 kg/cm$^2$G for 4 hours. Then, the treated product was dried at 100° C. for 24 hours to obtain a boehmite.

The crystal form of the boehmite is such that the distance between the opposing crystal faces perpendicular to the c-axis (length C) is about 200 Å and the maximum length in the direction of the a-axis (length A) is about 12000 Å A in an average.

A boehmite shaped product made of the above boehmite crystals and having the same size as Example 1 was heated under the same conditions as in Example 1. The shaped product thus treated was found to have cracks.

What is claimed is:

1. A boehmite having an orthorhombic crystal form in which the ratio of the maximum length in the direction of the a-axis of the crystal to the distance between the opposing crystal faces perpendicular to the c-axis of said crystal is at least 10, said maximum length in the direction of the a-axis of the crystal is at least 2500 Å and said distance between the opposing faces perpendicular to the c-axis of said crystal is 250–900 Å.

* * * * *

UNITED STATES PATENT AND TRADEMARK OFFICE
CERTIFICATE OF CORRECTION

PATENT NO. : 4,716,029

DATED : Dec. 29, 1987

INVENTOR(S) : Yasuo Oguri, et al.

It is certified that error appears in the above-identified patent and that said Letters Patent is hereby corrected as shown below: On the title page -- The Foreign Application Priority Data should list only the following:

Aug. 23, 1983 [JP]  Japan ..................58-153466

-- Delete the following from the Foreign Application Priority Data:

Feb. 23, 1982 [JP]  Japan ................... 57-28008
  Oct. 29, 1982 [JP]  Japan ..................57-190074

Signed and Sealed this

Second Day of August, 1988

Attest:

DONALD J. QUIGG

Attesting Officer

Commissioner of Patents and Trademarks